US 6,542,052 B2

(12) United States Patent
Matsumura et al.

(10) Patent No.: US 6,542,052 B2
(45) Date of Patent: Apr. 1, 2003

(54) MONOLITHIC LC COMPONENTS

(75) Inventors: Sadayuki Matsumura, Takefu (JP); Noboru Kato, Moriyama (JP); Hiroko Nomura, Fukui-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/908,333

(22) Filed: Jul. 18, 2001

(65) Prior Publication Data
US 2002/0057139 A1 May 16, 2002

(30) Foreign Application Priority Data
Aug. 9, 2000 (JP) ........................................ 2000-241597

(51) Int. Cl.⁷ ................................................ H03H 7/01
(52) U.S. Cl. ...................................... 333/175; 333/185
(58) Field of Search ............................... 333/175, 177, 333/184, 185, 204, 174

(56) References Cited
U.S. PATENT DOCUMENTS 5,696,471 A * 12/1997 Fujiwara ..................... 333/177
5,834,994 A * 11/1998 Shapiro ....................... 333/185
5,945,892 A * 8/1999 Kato et al. ................... 333/185

FOREIGN PATENT DOCUMENTS

| EP | 0760533 | | 3/1997 |
| EP | 1083621 | | 3/2001 |
| JP | 0107602 A | * | 6/1984 |
| JP | 06125201 A | * | 5/1994 |
| JP | 9-214274 | | 8/1997 |
| JP | 9-219315 | | 8/1997 |
| JP | 11-251856 | | 9/1999 |
| JP | 2000165171 A | * | 6/2000 |

* cited by examiner

Primary Examiner—Seungsook Ham
(74) Attorney, Agent, or Firm—Keating & Bennett, LLP

(57) ABSTRACT

A monolithic conduct includes a laminated stack of insulator sheets and inductor via-holes that are connected to each other in the direction in which the insulator sheets are laminated, thereby forming columnar inductors. Coupling adjusting via-holes are also connected to each other in the direction in which the insulator sheets are laminated, thereby forming a columnar coupling adjusting conductor. The columnar coupling adjusting conductor is disposed between and substantially parallel to the columnar inductors.

18 Claims, 7 Drawing Sheets

MONOLITHIC LC COMPONENTS

BACKGROUND OF INVENTION

1. Field of the Invention

The present invention generally relates to monolithic LC components, and more particularly, to a monolithic LC component, such as a band-pass filter, including a plurality of LC resonators.

2. Description of the Related Art

A known monolithic LC component includes a monolithic LC band-pass filter constructed as shown in FIGS. 7 and 8. A monolithic LC band-pass filter 1 includes, as shown in FIG. 7, ceramic sheets 2–8 provided with inductor via-holes 10a–10d and 11a–11d, resonating capacitor patterns 13 and 14, input/output capacitor patterns 17 and 18, and shield patterns 20 and 21.

The ceramic sheets 2–8 are laminated, and protective ceramic sheets are provided on the upper surface of the ceramic sheet 2 and the lower surface of the ceramic sheet 8. Thereafter, the ceramic sheets 2–8 with the protective sheets are fired, thereby producing a monolithic element 24 shown in FIG. 8. An input terminal P1, an output terminal P2, and ground terminals G1 and G2 are provided on the monolithic element 24. The input/output capacitor pattern 17 is connected to the input terminal P1, while the input/output capacitor pattern 18 is connected to the output terminal P2. The shield patterns 20 and 21 are connected to the ground terminals G1 and G2.

In the band-pass filter 1, the inductor via-holes 10a–10d and 11a–11d are connected to each other in the direction in which the ceramic sheets 2–8 are laminated (in the Z-axis direction), thereby forming columnar inductors L1 and L2, respectively. The resonating capacitor patterns 13 and 14 are disposed on the X-Y plane of the ceramic sheet 4, and face the shield pattern 20 with the ceramic sheets 2 and 3 held therebetween, thereby defining resonating capacitors 2 C1 and C2, respectively. The columnar inductor L1 and the resonating capacitor C1 define an LC resonator Q1, while the columnar inductor L2 and the resonating capacitor C2 define an LC resonator Q2. The LC resonators Q1 and Q2 are arranged such that they are separated from each other with a predetermined space therebetween, and are electromagnetically coupled to each other with a suitable coupling coefficient. The input/output capacitor patterns 17 and 18 face the resonating capacitor patterns 13 and 14, respectively, with the ceramic sheets 4 and 5 held therebetween, thereby defining an input capacitor C3 and an output capacitor C4, respectively.

When narrow-bandwidth filtering characteristics are required in the above-configured band-pass filter 1, the distance between the LC resonators Q1 and Q2 should be increased so as to inhibit electromagnetic coupling therebetween. However, to increase the space between the LC resonators Q1 and Q2, the LC resonators Q1 and Q2 must be located at the edges of the band-pass filer 1. This weakens the shielding effect of the shield patterns 20 and 21 on the LC resonators Q1 and Q2, and thus, the Q characteristics of the LC resonators Q1 and Q2 are lowered. Conventionally, therefore, the band-pass filter 1 must be enlarged in order to maintain the characteristics of the LC resonators Q1 and Q2 at a high level.

SUMMARY OF THE INVENTION

In order to overcome the problems described above, preferred embodiments of the present invention provide a compact monolithic LC component in which high Q characteristics of resonators can be achieved while meeting the requirements of narrow-bandwidth filtering characteristics.

According to a first preferred embodiment of the present invention, a monolithic LC component includes a monolithic element defined by laminated insulator layers, a plurality of electromagnetically coupled LC resonators each defined by an inductor and a capacitor disposed in the monolithic element, the inductor being defined by connecting via-holes in a direction in which the insulator layers are laminated, a coupling adjusting conductor defined by connecting via-holes in the direction in which the insulator layers are laminated, wherein the coupling adjusting conductor is disposed between at least two of the adjacent LC resonators so as to adjust a coupling coefficient between the adjacent LC resonators and the coupling adjusting conductor is grounded.

As discussed above, the coupling adjusting conductor defined by connecting via-holes in the direction in which the insulator layers are laminated (in the X-axis direction) is disposed between two adjacent LC resonators. Thus, the mutual inductance between the inductors of the adjacent LC resonators can be adjusted by the coupling adjusting conductor, thereby changing the coupling coefficient between the adjacent LC resonators. It is thus possible to inhibit the coupling coefficient of the adjacent LC resonators without the need for increasing the distance therebetween. Accordingly, the LC resonators do not have to be located at the edges of the LC component. As a result, the Q characteristics of the LC resonators can be maintained.

The inductors of the adjacent LC resonators, between which the coupling adjusting conductor is interposed, may be electrically connected to each other by a coupling adjusting conductor pattern disposed on the surface (X-Y plane) of the insulator layer. With this arrangement, the range of adjustments of the coupling coefficient can be extended.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Monolithic LC components of the present invention are described in detail below with reference to the accompanying drawings through illustration of preferred embodiments.

Figure 1:
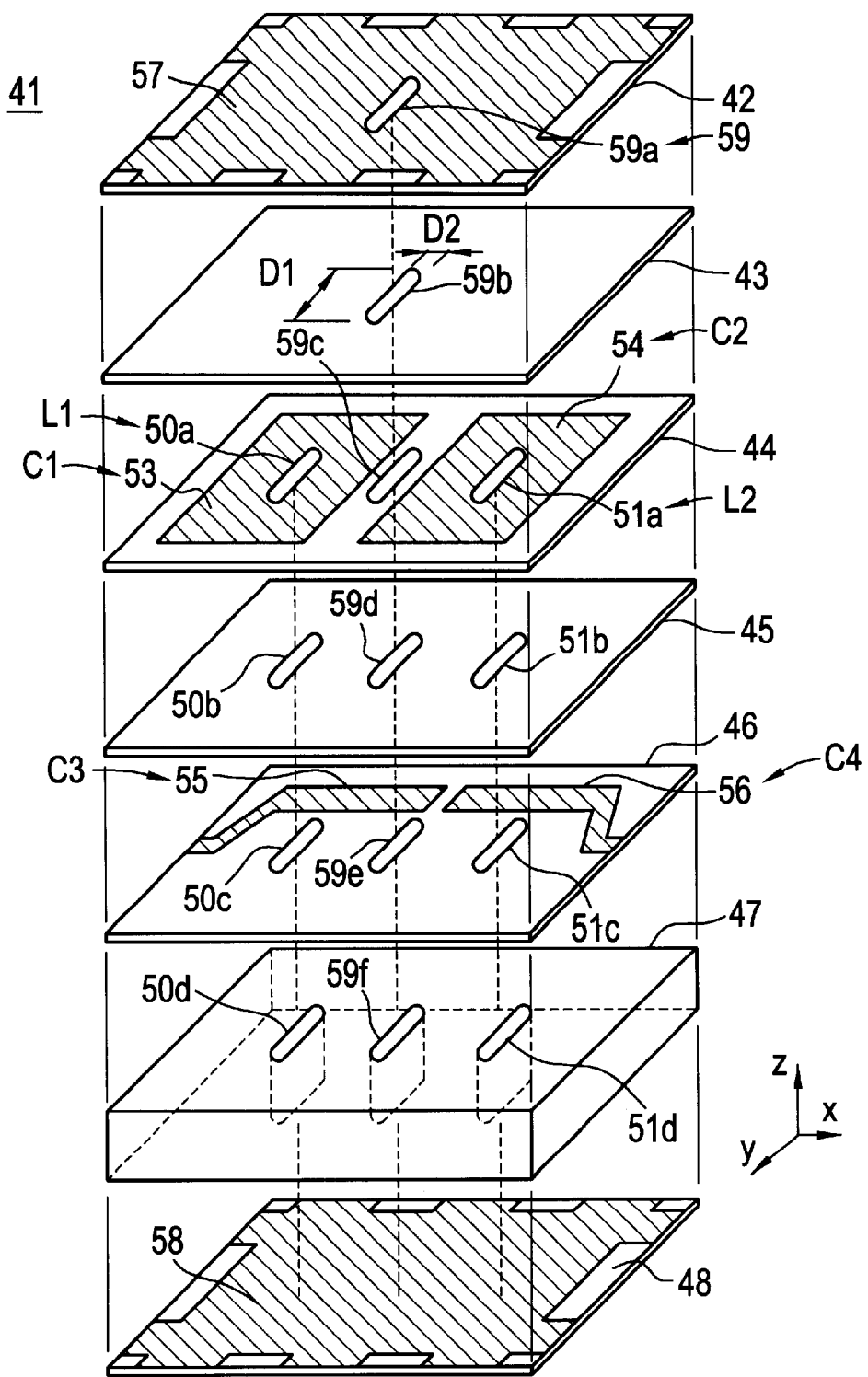
FIG. 1 is an exploded perspective view illustrating a monolithic LC component according to a first preferred embodiment of the present invention.
Figure 2:
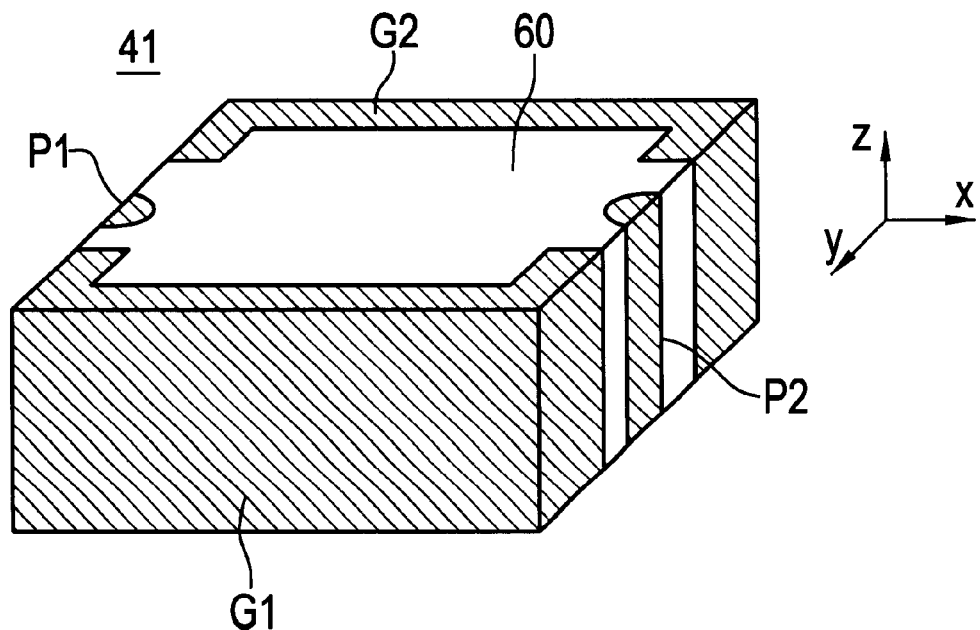
FIG. 2 is an external perspective view illustrating the monolithic LC component shown in FIG. 1.
Figure 3:
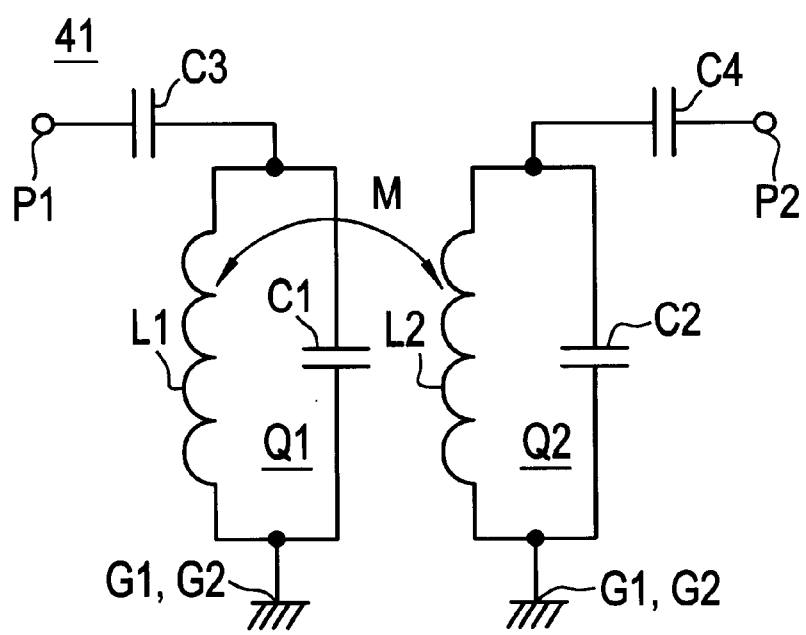
FIG. 3 is an electrical equivalent circuit diagram illustrating the monolithic LC component shown in FIG. 1.

A first preferred embodiment of the present invention is described below with reference to FIGS. 1 through 3. FIG. 1 illustrates the configuration of a monolithic LC band-pass filter 41, and FIGS. 2 and 3 are an external perspective view and an electrically equivalent circuit diagram, respectively, of the band-pass filter 41.

The band-pass filter 41 preferably includes, as shown in FIG. 1, insulator sheets 42–48 provided with inductor via-holes 50a–50d and 51a–51d, resonating capacitor patterns 53 and 54, an input capacitor pattern 55, an output capacitor pattern 56, shield patterns 57 and 58, and coupling adjusting via-holes 59a–59f. The insulator sheets 42–48 are preferably formed by kneading a dielectric ceramic powder or a magnetic powder with a coupling agent. The patterns 53–58 are preferably made of at least one of Ag, Pd, Cu, Ni, Au, or Ag—Pd or other suitable material, and are formed preferably by a method, such as printing, sputtering, or deposition or other suitable method. The inductor viaholes 50a–51d and the coupling adjusting via-holes 59a–59f are formed in desired configurations by punching the insulator sheets 42–47 with a mold or a laser, and by filling the holes with a conductive material, such as Ag, Pd, Cu, Ni, Au, or Ag—Pd or other suitable material.

The inductor via-holes 50a–50d and 51a–51d are connected to each other in the direction in which the insulator sheets 44–48 are laminated (in the Z-axis direction), thereby forming columnar inductors L1 and L2, respectively. That is, the axial direction of the inductors L1 and L2 is substantially perpendicular to the surface (X-Y plane) of the insulator sheets 44–48. By adjusting the thickness of the insulator sheet 47, the inductance values of the inductors L1 and L2 can be changed. In the first preferred embodiment, because of the capacitance values of an input capacitor C3 and an output capacitor C4 (discussed below), the insulator sheet 47 is thicker than the insulator sheets 44 and 45. However, if the input capacitor C3 and the output capacitor C4 have smaller capacitance values, or if the insulator sheets 44 and 45 have greater dielectric constants, the distances between the resonating capacitor patterns 53 and 54 and the input capacitor pattern 55 and the output capacitor pattern 56, respectively, should be greater. In this case, the insulator sheets 44 and 45 are thicker than the insulator sheet 47. The insulator sheet 47 may be formed as a single thick sheet, or may be formed by laminating a plurality of thin sheets, such as the insulator sheets 44 and 45.

One end (via-hole 50d or 51d) of each of the inductors L1 and L2 is connected to and short-circuited by the shield pattern 58. The other ends (via-holes 50a and 51a) of the inductors L1 and L2 are connected to the resonating capacitor patterns 53 and 54, respectively. When a current flows in the inductor L1 or L2, a magnetic field is generated around the inductor L1 or L2 to circulate on the plane that is substantially perpendicular to the axial direction of the inductor L1 or L2.

The resonating capacitor patterns 53 and 54 are disposed on the X-Y plane of the insulator sheet 44, and face the shield pattern 57 with the insulator sheets 42 and 43 held therebetween, thereby defining resonating capacitors C1 and C2, respectively. The resonating capacitor pattern 53 is connected to one end (via-hole 50a) of the inductor L1. The inductor L1 and the capacitor C1 define an LC resonator Q1. The resonating capacitor pattern 54 is directly connected to one end (via-hole 51a) of the inductor L2. The inductor L2 and the capacitor C2 define an LC resonator Q2. A mutual inductance M is defined between the inductor viaholes 50a through 50d and 51a through 51d, respectively, thereby magnetically coupling the resonators Q1 and Q2.

The input capacitor pattern 55 is extended to the left side of the sheet 46, while the output capacitor pattern 56 is extended to the right side of the sheet 46. The input capacitor pattern 55 and the output capacitor pattern 56 face the resonating capacitor patterns 53 and 54, respectively, with the insulator sheets 44 and 45 held therebetween, thereby defining the input capacitor C3 and the output capacitor C4, respectively.

The coupling adjusting via-holes 59a through 59f are located substantially at the center of the insulator sheets 42–47, respectively, and are connected to each other in the direction in which the insulator sheets 42–47 are laminated (in the Z-axis direction), thereby defining a columnar coupling adjusting conductor 59. The columnar coupling adjusting conductor 59 is disposed between and substantially parallel to the columnar inductors L1 and L2 in the Z-axis direction. One end (via-hole 59f) of the columnar coupling adjusting conductor 59 is connected to the shield pattern 58, while the other end (via-hole 59a) is connected to the shield pattern 57. As in the inductor via-holes 50a–50d and 51a–51d, in the coupling adjusting via-holes 59a–59f, the length D1 is longer than the width D2 in cross section. For example, D1 is about 1.2 mm, and D2 is about 0.2 mm.

The shield patterns 57 and 58 are arranged to occupy a large area (X-Y plane) of the insulator sheets 42 and 48, respectively. The LC resonators Q1 and Q2 are disposed between the shield patterns 57 and 58.

The insulator sheets 42–48 are laminated in the order shown in FIG. 1, and protective insulator sheets are provided on the upper surface of the insulator sheet 42 and the lower surface of the insulator sheet 48. Then, the insulator sheets 42–48 with the protective sheets are integrally fired, thereby producing a monolithic element 60 shown in FIG. 2 (for example, L=5 mm, W=4 mm, and H=2 mm). An input terminal P1 and an output terminal P2 are respectively disposed at the left surface and the right surface of the monolithic element 60. Ground terminals G1 and G2 are respectively disposed at the proximal surface and the distal surface of the monolithic element 60. The input capacitor pattern 55 is connected to the input terminal P1, while the output capacitor pattern 56 is connected to the output terminal P2. The shield patterns 57 and 58 are connected to the ground terminals G1 and G2.

In the band-pass filter 41 configured as described above, the columnar coupling adjusting conductor 59 defined by the coupling adjusting via-holes 59a–59f is disposed between the LC resonators Q1 and Q2. It is thus possible to adjust the mutual inductance M between the columnar inductors L1 and L2 of the LC resonators Q1 and Q2 by the coupling adjusting conductor 59. As a result, the coupling coefficient between the LC resonators Q1 and Q2 can be changed. That is, in the band-pass filter 41 constructed in accordance with the first preferred embodiment, the coupling adjusting conductor 59 is disposed in a longitudinal configuration in cross section, as shown in FIG. 1, thereby considerably reducing the magnetic coupling coefficient between the columnar inductors L1 and L2 of the LC resonators Q1 and Q2, respectively.

Accordingly, the coupling coefficient between the LC resonators Q1 and Q2 can be inhibited without the need for increasing the distance therebetween. Thus, the LC resonators Q1 and Q2 do not have to be disposed at the edges of the band-pass filter 41. As a result, Q characteristics of the LC resonators Q1 and Q2 can be maintained.

A second preferred embodiment of the present invention is now described with reference to FIGS. 4 and 5.

Figure 4:
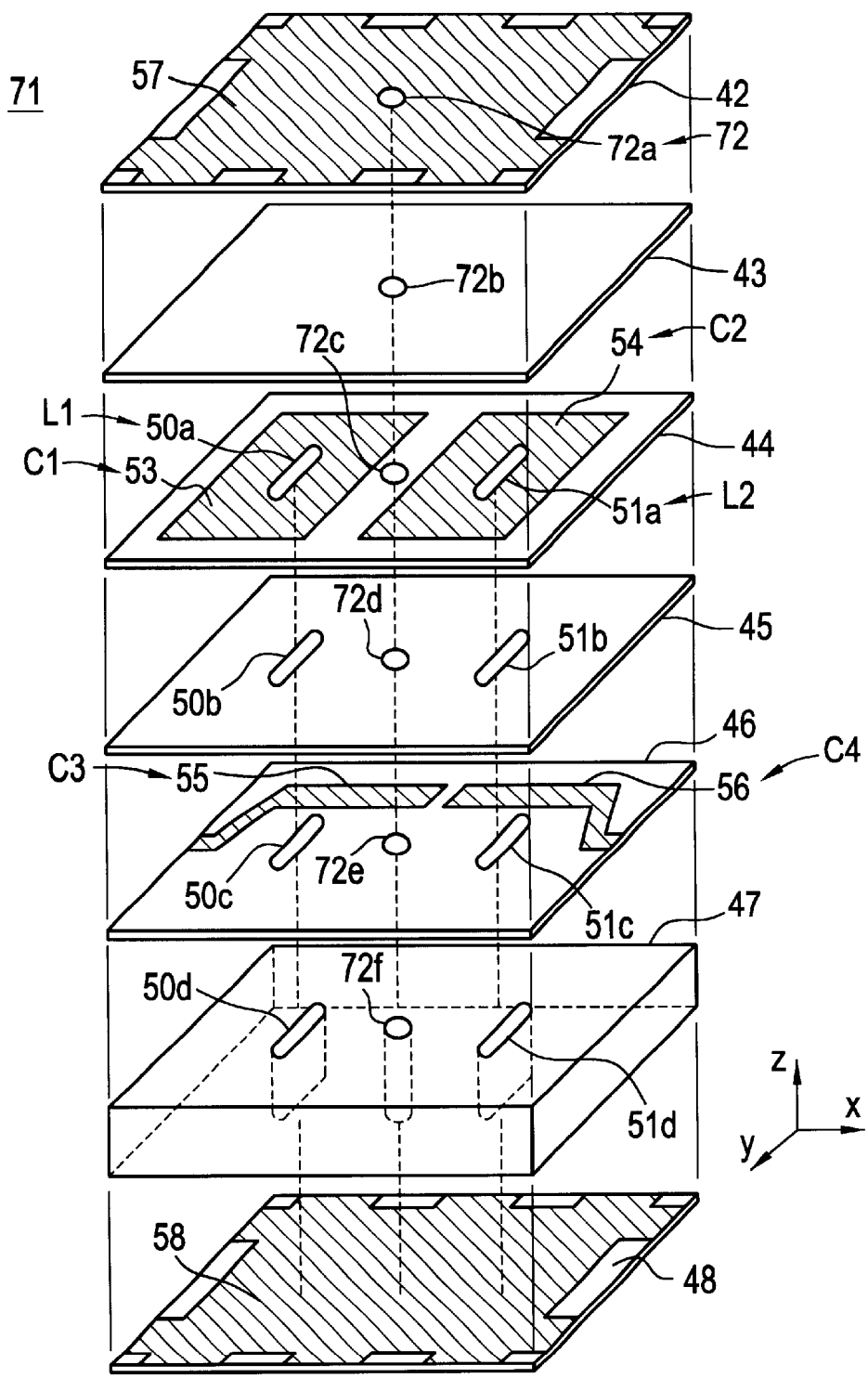
FIG. 4 is an exploded perspective view illustrating a monolithic LC component according to a second preferred embodiment of the present invention.
Figure 5:
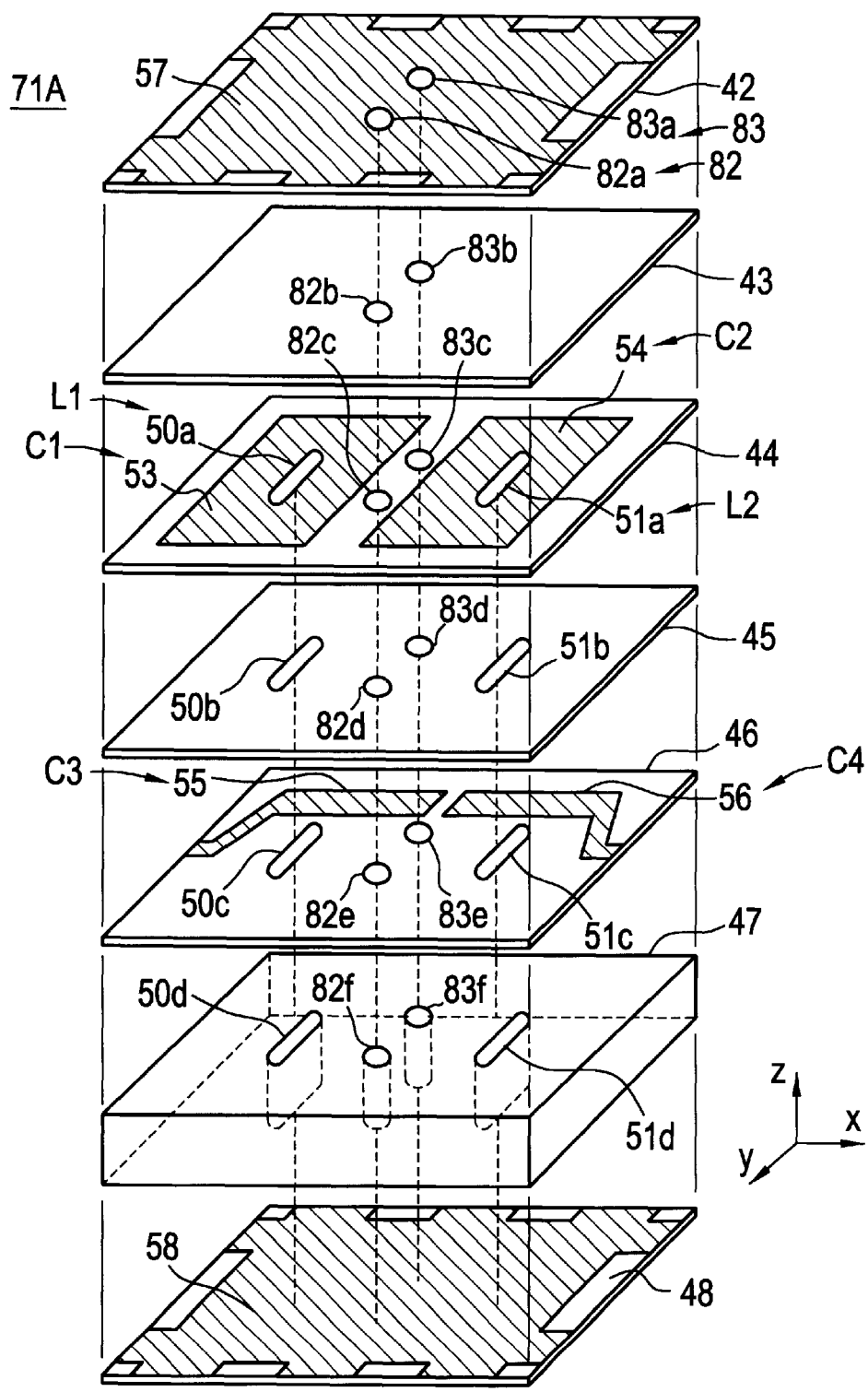
FIG. 5 is an exploded perspective view illustrating a modification made to the monolithic LC component shown in FIG. 4.

FIG. 4 illustrates the configuration of a band-pass filter 71 of the second preferred embodiment. In the second preferred embodiment, as shown in FIG. 4, instead of the coupling adjusting conductor 59 of the band-pass filter 41 of the first preferred embodiment shown in FIG. 1, a coupling adjusting conductor 72 having a small, substantially circular cross section is provided. The coupling adjusting conductor 72 is defined by providing coupling adjusting via-holes 72a–72f substantially at the center of the insulator sheets 42–47, respectively, and by connecting them to each other in the direction in which the insulator sheets 42–47 are laminated (in the Z-axis direction). In FIG. 4, the elements that are the same as those shown in FIG. 1 are designated with like reference numerals, and an explanation thereof will thus be omitted. In the monolithic band-pass filter 71 configured as described above, since the cross sectional configuration of the coupling adjusting conductor 72 is a small circle, the coupling coefficient between the LC resonators Q1 and Q2 can be suppressed by a small amount. That is, the coupling coefficient between the LC resonators Q1 and Q2 can be adjusted in fine increments.

The number and the positions of coupling adjusting conductors may be changed. For example, the band-pass filter 71 may be modified, as shown in FIG. 5, to a bandpass filter 71A provided with two columnar coupling adjusting conductors 82 and 83 which are respectively defined by connecting coupling adjusting via-holes 82a–82f and 83a–83f. With this arrangement, the coupling coefficient between the LC resonators Q1 and Q2 can be changed.

Figure 6:
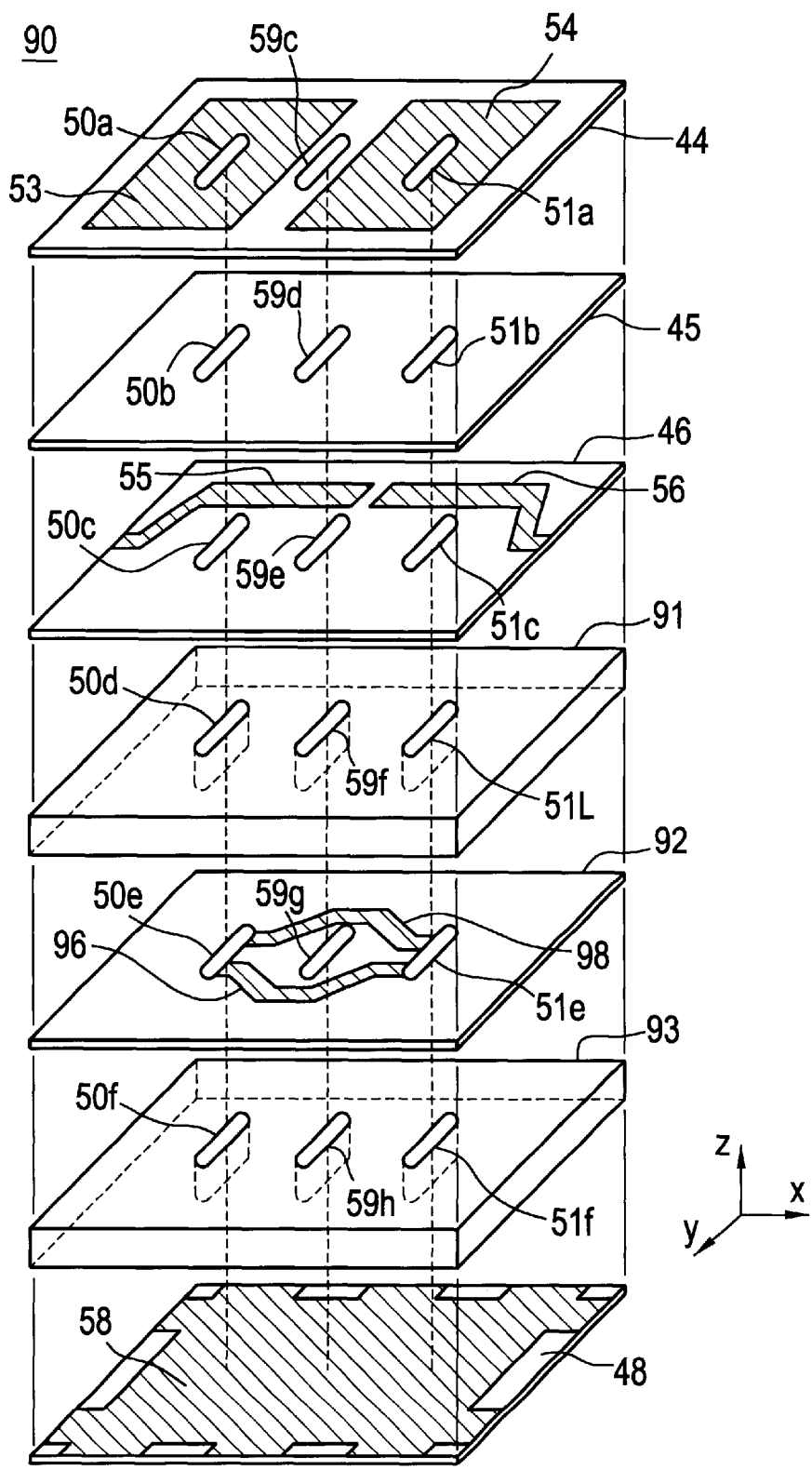
FIG. 6 is a partially exploded perspective view illustrating a monolithic LC component according to a third preferred embodiment of the present invention.
Figure 7:
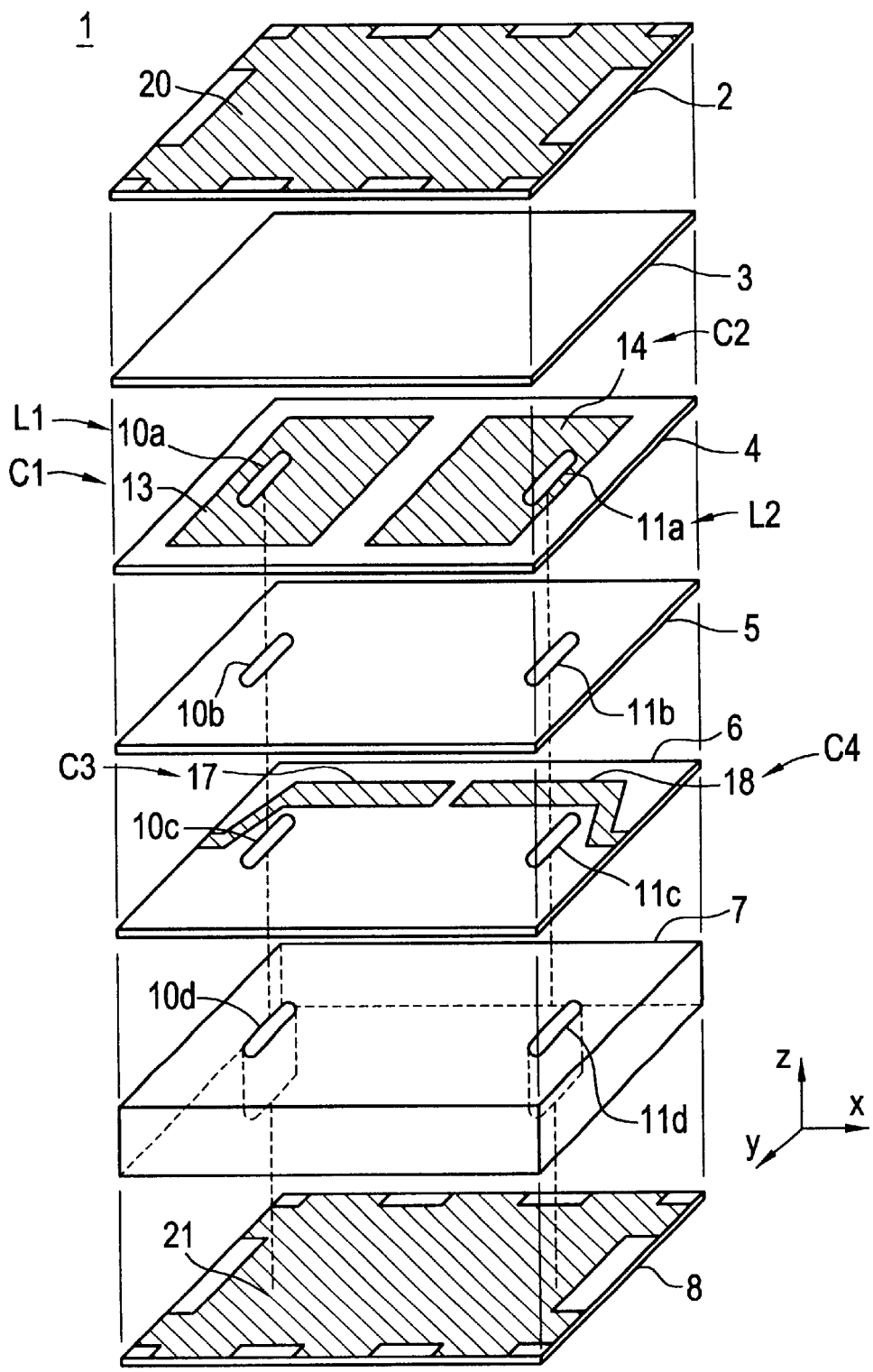
FIG. 7 is an exploded perspective view illustrating a conventional monolithic LC component.
Figure 8:
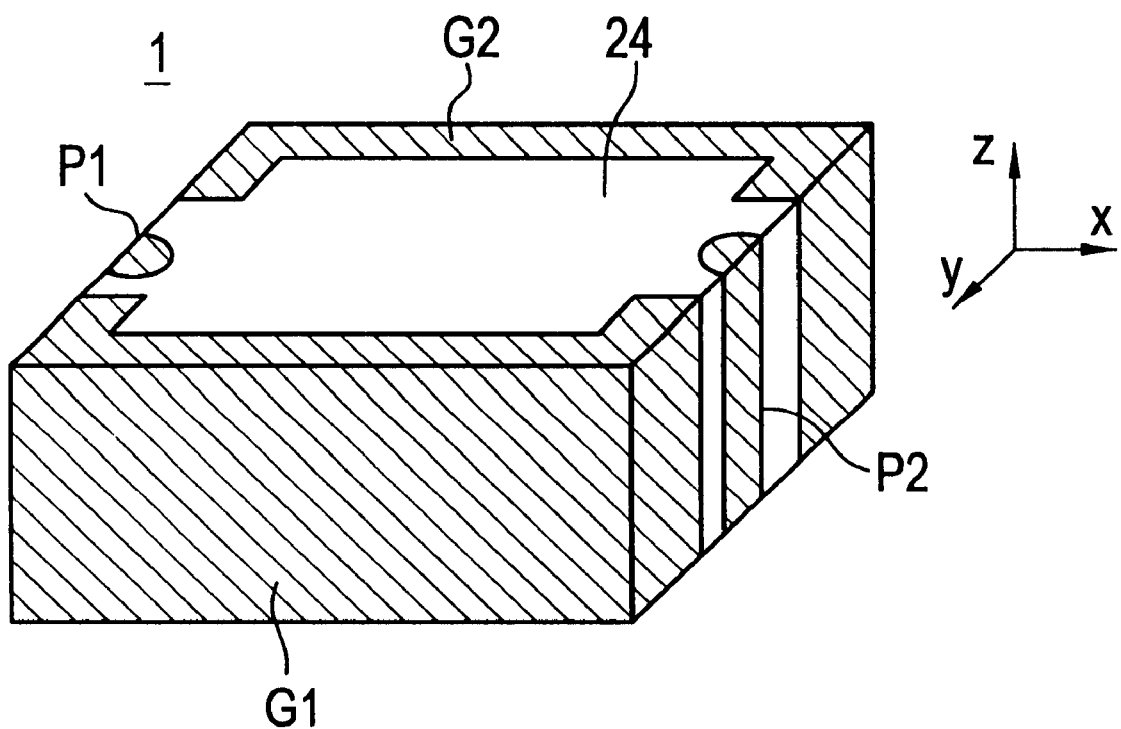
FIG. 8 is an external perspective view illustrating the monolithic LC component shown in FIG. 7.

FIG. 6 illustrates the configuration of a band-pass filter 90 according to a third preferred embodiment of the present invention. In FIG. 6, the elements that are the same as those shown in FIG. 1 are indicated by like reference numerals, and an explanation thereof will thus be omitted. In the third preferred embodiment, instead of the insulator sheet 47 of the band-pass filter 1 of the first preferred embodiment shown in FIG. 1, insulator sheets 91, 92, and 93 are used.

Inductor via-holes 50d–50f and 51d–51f, and coupling adjusting via-holes 59f–59h are provided on the insulator sheets 91–93, respectively. On the surface of the insulator sheet 92, two coupling adjusting conductor patterns 96 and 98 for electrically connecting the inductor via-holes 50e and 51e are arranged on the X-Y plane to surround the coupling adjusting via-hole 59g.

In the band-pass filter 90, the positions of the coupling adjusting conductor patterns 96 and 98 may be changed. For example, the coupling adjusting conductor patterns 96 and 98 may be positioned along the thickness of the filter 90, thereby varying the coupling coefficient between the LC resonators Q1 and Q2. More specifically, the coupling adjusting conductor patterns 96 and 98 may be shifted toward the resonator capacitor patterns 53 and 54 in the direction in which the insulator sheets 44 through 48 are laminated, thereby increasing the coupling coefficient between the LC resonators Q1 and Q2. Conversely, the coupling adjusting conductor patterns 96 and 98 may be shifted toward the shield pattern 58, thereby decreasing the coupling coefficient between the LC resonators Q1 and Q2. As a result, the range of adjustments of the coupling coefficient between the LC resonators Q1 and Q2 can be extended.

The monolithic LC components of the present invention are not restricted to the foregoing preferred embodiments, and various modifications may be made within the spirit and the scope of the appended claims.

The LC components include not only band-pass filters, but also low-pass filters, high-pass filters, a duplexer defined by a combination of band-pass filters, and a duplexer defined by a combination of different types of circuits, such as a low-pass filter, a high-pass filter, and a trap circuit. The LC components also include a triplexer and a multiplexer, which have a plurality of built-in filters in a single monolithic element or have a built-in filter and another type of circuit. A coupler having a built-in band-pass filter in which a coupling line is provided along the lamination of insulator layers in accordance with the columnar inductors defined by via-holes may also be used.

Although in the foregoing preferred embodiments the inductor via-holes 50a–50d and 51a–51d define columnar inductors having an elongated shape in cross section, they may be configured to have a substantially cylindrical shape, as in the coupling adjusting conductor 72 of the second preferred embodiment (FIG. 4). Alternatively, the inductors defined by inductor via-holes may be substantially cylindrical, and the coupling adjusting conductor may be elongated in cross section.

The shield pattern may be formed only one of the upper surface or the lower surface of the monolithic element. The number of LC resonators is not limited to two, and more LC resonators may be provided. A coupling adjusting conductor does not necessarily need to be provided between the entire LC resonators. The cross-sectional configuration, the number, the length, and the position of coupling adjusting conductors may be changed, in which case, the coupling coefficient between the LC resonators can be adjusted.

The coupling adjusting conductor patterns 96 and 98 used in the third preferred embodiment may have a desired shape, such as a straight line, a V shape, or an arc, as long as they connect the inductor via-holes 50e and 51e. However, a coupling current flows in the coupling adjusting conductor pattern 96 or 98, and it may be reflected at a corner of the angular-shaped (V-shaped) coupling adjusting conductor 96 or 98. Accordingly, the coupling adjusting conductor patterns 96 and 98 preferably have a smooth shape, such as an arc.

In the foregoing preferred embodiments, the insulator sheets provided with conductor patterns and via-holes are laminated and are then integrally fired. However, pre-fired insulator sheets may be used.

Alternatively, an LC component may be fabricated according to the following method. An insulator layer may be formed by a paste-like insulating material by means such as printing, and then, a paste-like conductor material may be applied to the surface of the insulator layer, thereby defining conductor patterns and via-holes. Subsequently, a paste-like insulating material may be applied to the conductor patterns and the via-holes, thereby defining another insulator layer. Similarly, the paste-like insulating material and the paste-like conductor material may be alternately applied, thereby defining a monolithic LC component.

While the present invention has been particularly shown and described with reference to preferred embodiments thereof, it will be understood by those skilled in the art that the foregoing and other changes in form and details can be made without departing from the spirit and scope of the invention.

What is claimed is:

1. A monolithic LC component comprising:
   a monolithic element including laminated insulator layers and via-holes formed in the monolithic element;
   a plurality of electromagnetically coupled LC resonators, each of said plurality of LC resonators being defined by an inductor and a capacitor disposed in said monolithic element, said inductor being defined by a first group of the via-holes that are connected in a direction in which said insulator layers are laminated; and a coupling adjusting conductor defined by a second group of the via-holes connected in the direction in which said insulator layers are laminated, said coupling adjusting conductor being disposed between at least two of the adjacent LC resonators so as to adjust a coupling coefficient between said adjacent LC resonators, said coupling adjusting conductor being grounded; and a coupling adjusting conductor pattern disposed on a surface of one of the insulator layers, wherein the inductors of said two adjacent LC resonators, between which said coupling adjusting conductor is interposed, are electrically connected to each other by said coupling adjusting conductor pattern.

2. A monolithic LC component according to claim 1, further comprising resonating capacitor patterns, an input capacitor pattern, an output capacitor pattern, and shield patterns provided on said insulator layers.

3. A monolithic LC component according to claim 1, wherein the first group of via-holes is defined by inductor via-holes and the second group of via-holes is defined by coupling adjusting via-holes.

4. A monolithic LC component according to claim 3, wherein the inductor via-holes are connected to each other to define columnar inductors.

5. A monolithic LC component according to claim 1, wherein one of the laminated insulator layers is thicker than the others of the laminated insulator layers.

6. A monolithic LC component according to claim 2, wherein a first end of each of the inductors is connected to and short-circuited by at least one of the shield patterns, and a second end of each of the inductors is connected to the resonating capacitor patterns.

7. A monolithic LC component according to claim 1, further comprising first and second LC resonators which are magnetically coupled to each other.

8. A monolithic LC component according to claim 2, wherein the input capacitor pattern is extended to the left side of the monolithic element and the output capacitor pattern is extended to the right side of the monolithic element.

9. A monolithic LC component according to claim 1, wherein the coupling adjusting conductor has a substantially circular cross section.

10. A monolithic LC component according to claim 1, wherein the second group of via-holes defining the coupling adjusting conductor is located substantially at the center of the laminated insulator layers.

11. A monolithic LC component comprising:

a monolithic element including laminated insulator layers and via-holes formed in the monolithic element;

a plurality of electromagnetically coupled LC resonators, each of said plurality of LC resonators being defined by an inductor and a capacitor disposed in said monolithic element, said inductor being defined by a first group of the via-holes that are connected in a direction in which said insulator layers are laminated; and a coupling adjusting conductor defined by a second group of the via-holes connected in the direction in which said insulator layers are laminated, said coupling adjusting conductor being disposed between at least two of the adjacent LC resonators so as to adjust a coupling coefficient between said adjacent LC resonators, said coupling adjusting conductor being grounded; wherein the first group of via-holes is defined by inductor via-holes and the second group of via-holes is defined by coupling adjusting via-holes; and two coupling adjusting conductor patterns arranged to electrically connect the inductor via-holes to surround at least one of the coupling adjusting via-holes.

12. A monolithic LC component according to claim 1, wherein the monolithic LC component is one of a band-pass filter, a low-pass filter, a high-pass filter, a duplexer, a triplexer, and a multiplexer.

13. A monolithic LC component comprising:

a monolithic element including laminated insulator layers;

first and second electromagnetically coupled LC resonators, each of said first and second LC resonators being defined by an inductor and a capacitor disposed in said monolithic element, said inductor being defined by inductor via-holes that are formed in the monolithic element and connected in a direction in which said insulator layers are laminated;

a coupling adjusting conductor defined by coupling adjusting via-holes that are formed and connected in the direction in which said insulator layers are laminated, said coupling adjusting conductor being disposed between at least two of the adjacent LC resonators so as to adjust a coupling coefficient between said adjacent LC resonators, said coupling adjusting conductor being grounded; and a coupling adjusting conductor pattern disposed on a surface of one of the insulator layers, wherein the inductors of said two adjacent LC resonators, between which said coupling adjusting conductor is interposed, are electrically connected to each other by said coupling adjusting conductor pattern.

14. A monolithic LC component according to claim 13, wherein one of the laminated insulator layers is thicker than the others of the laminated insulator layers.

15. A monolithic LC component according to claim 13, wherein the coupling adjusting conductor has a substantially circular cross section.

16. A monolithic LC component according to claim 13, wherein the coupling adjusting via-holes are located substantially at the center of the laminated insulator layers.

17. A monolithic LC component according to claim 13, further comprising two coupling adjusting conductor patterns arranged to electrically connect the inductor via-holes to surround at least one of the coupling adjusting via-holes.

18. A monolithic LC component according to claim 13, wherein the monolithic LC component is one of a band-pass filter, a low-pass filter, a high-pass filter, a duplexer, a triplexer, and a multiplexer.

* * * * *